United States Patent [19]

Westbrook

[11] 4,306,233
[45] Dec. 15, 1981

[54] ELECTRICAL DISPLAY DEVICE

[75] Inventor: Michael H. Westbrook, Colchester, England

[73] Assignee: Ford Motor Company, Dearborn, Mich.

[21] Appl. No.: 99,437

[22] Filed: Dec. 3, 1979

[30] Foreign Application Priority Data

Dec. 21, 1978 [GB] United Kingdom ............... 49606/78
Feb. 23, 1979 [GB] United Kingdom ............... 06568/79

[51] Int. Cl.³ ............................................. G06F 3/14
[52] U.S. Cl. .................................... 340/753; 340/784
[58] Field of Search ............. 340/753, 754, 784, 52 R, 340/22, 27 SS

[56] References Cited

U.S. PATENT DOCUMENTS

| 3,689,835 | 9/1972 | Bickfrod | 340/753 |
| 3,835,465 | 9/1974 | Tannas, Jr. et al. | 340/754 |
| 3,898,642 | 8/1975 | Dorey et al. | 340/753 |
| 3,934,241 | 1/1976 | Weigert | 340/753 |
| 4,127,848 | 11/1978 | Shanks | 340/784 |
| 4,203,104 | 5/1980 | Kmetz | 340/784 |
| 4,210,908 | 7/1980 | Sakakibara | 340/754 |

Primary Examiner—Marshall M. Curtis
Attorney, Agent, or Firm—Paul K. Godwin, Jr.; Clifford L. Sadler

[57] ABSTRACT

An electrical display device, such as a liquid crystal display, for an instrument such as a speedometer, where two or more units of measurement may be required, comprises a first display area (20) which extends along a line and which is formed to indicate a point along the line corresponding to the magnitude of a measured or selected value; a second display area (27) adjacent the line adapted to indicate a length along the line upon which the point may be indicated; and two further display areas (30), (35) which are formed to be activated separately from the first and second display areas and from each other, and adapted to indicate a respective scale markings against which the magnitude of the said value can be read, and said further display areas lying on the opposite side of the second display area from the first display area, and one of the further display areas including a part (36), (37) which forms an extension of the length of the line indicated by the second display area. By effectively increasing the length of the base line when the said one scale display area is activated, the indicia on the said one scale display area can be positioned between the indicia on the other scale display area, thus avoiding overlap of their electrodes and allowing the leads to the electrodes of both scale display areas to be positioned away from the leads to the electrodes for the first and second display areas.

6 Claims, 3 Drawing Figures

ELECTRICAL DISPLAY DEVICE

BACKGROUND OF THE INVENTION

1. Field of the Invention

This invention generally relates to electrical display devices.

2. Description of the Prior Art

Conventional electrical display devices usually comprise an electrode screen which is divided into a plurality of discrete electrode areas each arranged to co-operate with one or more other electrodes spaced from the electrode screen to define a plurality of display areas each capable of independent activation. For example, a typical liquid crystal display device includes two support sheets of transparent material each carrying an electrode screen and separated by a layer of liquid crystal material. The light transmission characteristics of the liquid crystal material are changed when an electrical potential is applied across two opposed electrode screens, thereby producing a pattern on the display. The electrode screens, which are deposited upon the support sheets by a printing process, are so shaped that the electrical potential can be applied selectively to adjacent areas of the display, thus allowing the pattern on the display to be changed, e.g. to represent numerals or letters. Other electrical display devices of this type include D.C. electroluminescent and vacuum fluorescent devices. In D.C. electroluminescent type displays, two electrode screens, one of which is transparent, are separated from each other by a layer of solid phosphor. The phosphor emits light when a direct current is passed through it. By suitably dividing and shaping the one electrode screen, different areas of the display can be activated separately allowing the separate areas to be viewed through the transparent electrode. In vacuum fluorescence displays, electrons are emitted from a hotwire filament in a vacuum tube and impinge upon a fluorescent anode, separate areas of which can be activated independently.

When display devices of that kind are used to give a visual display of a variable measured value, such as speed, one electrode screen usually defines a first display area which extends along a line and is adapted to indicate a point corresponding to the magnitude of the measured or selected value. At least one second display area is also adapted for activation separately from the first display area to indicate a scale against which the magnitude of the said value can be read.

It frequently occurs that a measured value can be expressed in more than one system of units. For example, speed is commonly measured either in miles per hour or kilometers per hour; radio frequency electromagnetic radiation is measured either in meters, as a wave-length, or in kilohertz, as a frequency; and temperatures may be measured in degrees Celsius, Fahrenheit or Absolute. Alternatively, the limits of variation in the value indicated on the display may be changed, as for example, where the display is used to indicate temperature in either °C. or °F., or forms part of an instrument capable of measuring more than one type of value, such as volts, amperes and resistance. If an electrical display device of the type to which this invention relates is to be used for such applications, a plurality of separate display areas must be provided each adapted to indicate a respective scale of units against which the magnitude of the value can be read. Each of the electrode areas must also be provided with its own leads in the form of strips of conductive material which connects the electrode area to a separate terminal. The electrode area must also be positioned adjacent the other display areas but without overlapping therewith. Where separate display areas are used to indicate separate scales, the positioning of the leads in a non-contacting configuration presents a major problem in the design of the display.

SUMMARY OF THE INVENTION

The present invention provides an electrical display device comprising an electrode screen which is divided into a plurality of discrete electrode areas. The electrode areas are arranged to co-operate with one or more counter electrodes spaced from the electrode screen to define a plurality of display areas capable of separate activation. The display areas are characterized in that a first display area extends along a line and is formed to indicate several points along that line corresponding to the magnitude of a measured or selected value. A second display area extends adjacent the first display area line and is formed to indicate a base line having a length along which the point may be located. Two other display areas are each formed so as to be activated separately from the first and second display areas and from each other. Each provides a scale of numerical markings within a given range against which the magnitude of the measured or selected value can be read. The two scale display areas are formed on the opposite side of the second display area from the first display area. A first one of the scale display areas includes a part which forms an extension of the length of the base line indicated by the second display area.

By effectively increasing the length of the base line when that first scale display area is activated, the numerical markings on that first scale display area can be positioned between the numerical markings on the other scale display area, thus avoiding overlap of their electrodes and allowing the leads to the electrodes of both scale display areas to be positioned away from the leads to the electrodes for the first and second display areas.

The display may be used to selectively indicate one of a plurality of measured or selected value along a graduated base line, e.g. radio frequency, temperature, or electrical current, resistance, potential or power. The preferred embodiment of the invention is used to indicate speed and therefore forms part of a vehicle speedometer, the scale display areas being calibrated in miles per hour, and kilometers per hour respectively.

The first display area may be formed in any suitable way to indicate individual points corresponding to the magnitude of a measured or selected value. For example, single points along the line in the first display area may be activated to correspondingly represent those values. Preferably however, the first display area is formed to display an entire section of the line having a length which varies with an input signal representing the measured or selected value. Thus, the first display area includes a plurality of inividual display zones adjacently arranged to form the line. Each individual display zone is adapted for separate activation. In use, increases in the measured or selected value will be indicated by activating the electrodes corresponding to zones adjacent to those already activated.

Any conventional electrical display system may be used in the invention, for example, a D.C. electroluminescent display, a vacuum fluorescent display, or a liquid crystal display. Suitable materials for and methods of construction of the systems will be known to those skilled in the art. Preferably, the system is a liquid crystal display of the twisted nematic type in which the liquid crystal material is retained between two polarizing filters having their directions of polarization oriented to be either parallel or crossed. When deactivated, the liquid crystal material rotates the plane of polarization of light passing through it by 90°. When activated, the liquid crystal material has no effect on the plane of polarization. As a result, the light is either transmitted or blocked by the second polarizing filter, depending upon its orientation relative to the first filter and the state of activation of the liquid crystal material. In the preferred embodiment of the invention, the two polarizing filters are oriented for parallel polarization so that the various areas of the display transmit light only when activated.

BRIEF DESCRIPTION OF THE DRAWINGS

A preferred embodiment of the invention will now be described, by way of example only, with reference to the drawings in which:

FIG. 3 is a plan of the opposing electrode screen of the display of FIG. 1.

DETAILED DESCRIPTION OF THE PREFERRED EMBODIMENT

Figure 1:
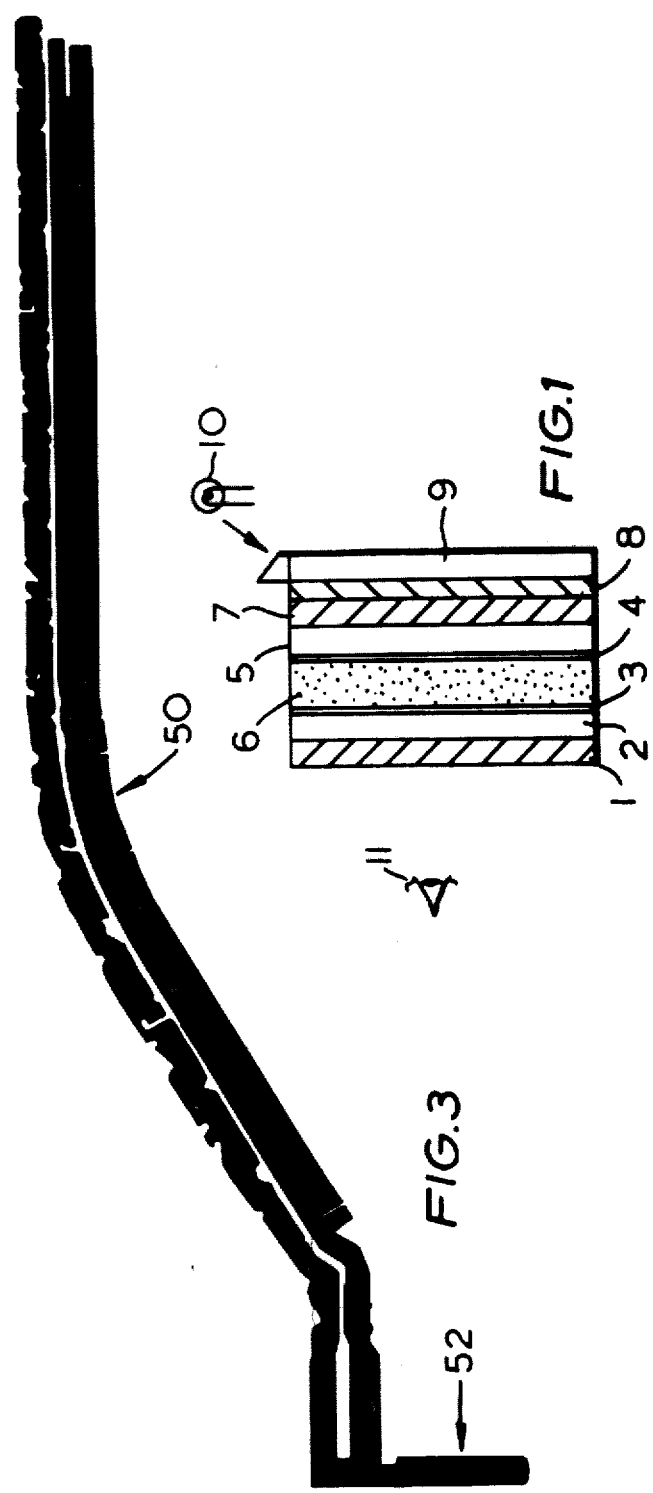
FIG. 1 is a view of a vertical cross-section through a liquid crystal display according to the invention.

Referring to FIG. 1, the liquid crystal display is generally rectangular in shape and comprises a first polarizing filter 1, through which the display is viewed. The first filter 1 overlies a transparent glass sheet 2 which supports a first electrode screen 3, illustrated in FIG. 2. A second electrode screen 4, illustrated in FIG. 3 is supported on a second transparent glass sheet 5 and is separated from the first electrode screen 3 by a layer of twisted neumatic liquid crystal material 6. The second glass sheet 5 overlies a second polarizing filter 7, which is oriented to polarize light in a direction parallel to the direction of polarization of the first filter 1. A color filter 8 is fixed to the rear of the second filter 7. An illumination panel 9 is fixed to the rear of the color filter 8 and receives light from one or more bulbs 10 mounted adjacent the edge of the panel 9. In use, light from the panel 9 passes through the second filter 7 and is polarized. Polarized light passing through an unactivated region of the liquid crystal layer 6 has its plane of polarization rotated through 90° and does not pass through the first filter 2. Areas of the display which are not activated therefore appear dark to the observer 11. Polarized light passing through activated areas of the display is unaffected by the liquid crystal material and is transmitted through the first polarizing filter 1. The activated areas of the display are therefore illuminated to the observer 11 and the light passing through the various activated areas of the display being affected by the color filter 8.

Figure 2:
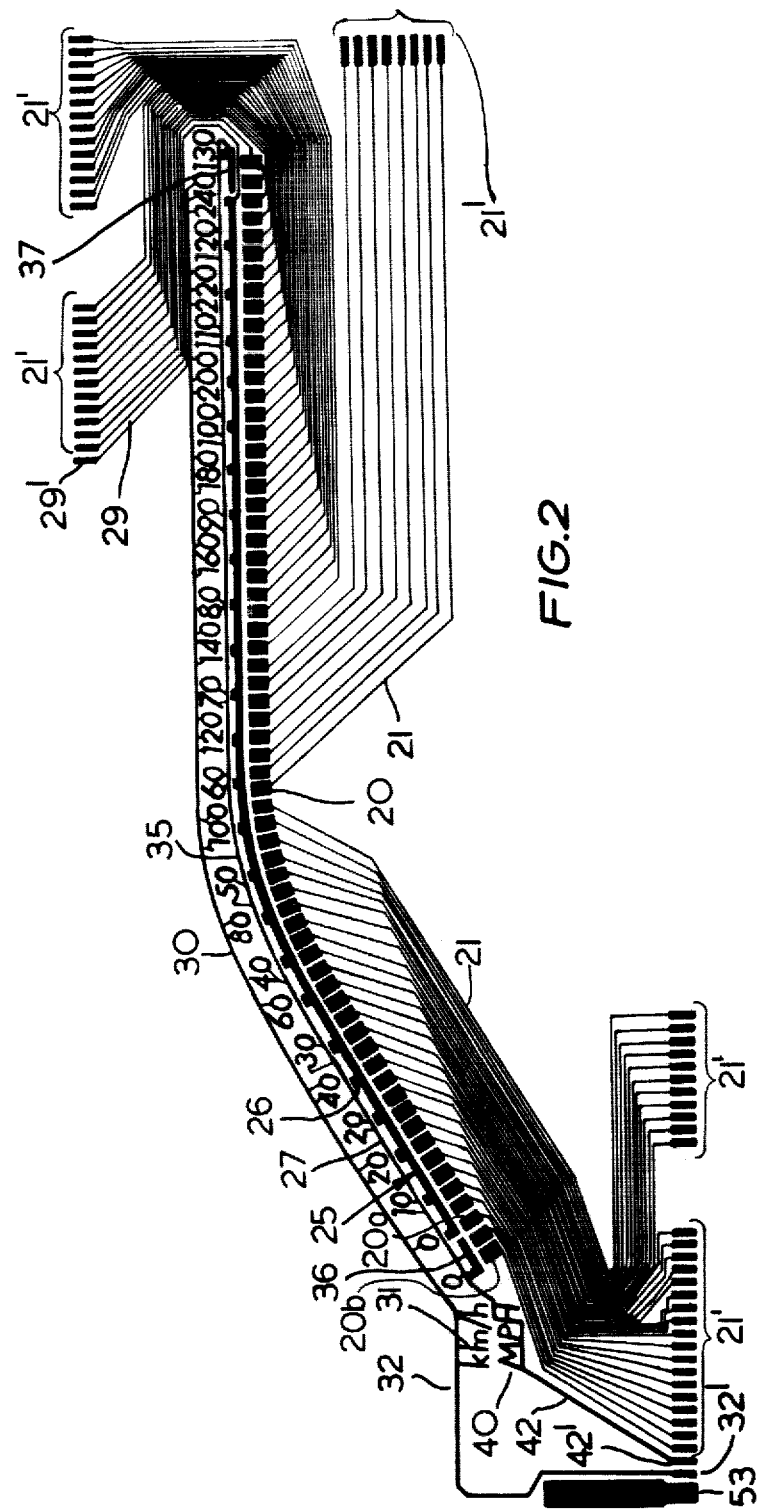
FIG. 2 is a plan view of one electrode screen of the display of FIG. 1.

Referring now to FIG. 2, the first electrode screen includes an array of square electrodes 20 formed along a line and each connected by a respective lead strip 21 to a terminal 21' at the edge of the glass sheet 2. A base line electrode 25 in the form of a continuous strip extends parallel to the line of the array of electrodes 20 and indicates a base line 27 subdivided by a set of graduation marks 26. The graduated base line electrode 25 is connected by a lead strip 29 to a terminal 29' at the edge of the glass sheet 2.

A first scale electrode 30 is located alongside the graduated base line electrode 25 parallel to the line of the array of square electrodes 20 and on the opposite side of the base line electrode therefrom. The first scale electrode 30 carries a series of numerical marking elements ranging from 0 to 240, in increments of 20. Each numerical marking element ranging is positioned alongside alternate ones of the graduation marks 26 of the base line electrode 25. The first scale electrode 30 also carries alphabetic symbols 31 indicating the units of the scale, as being km/h (kilometers per hour). A lead strip 32 connects the first scale electrode 30 to a terminal 32' at the edge of the glass sheet 2.

A second scale electrode 35 is positioned between the graduated base line electrode 25 and the first scale electrode 30 and extends parallel to the line of the array of square electrodes 20.

The second scale electrode 35 carries a series of numerical marking elements ranging from 10 to 120 in increments of 10, each marking element being positioned alongside alternate ones of the graduation marks 26 of the base line electrode 25 and between the numerical marking elements of the first scale electrode 30. The numerical marking elements of the first and second scale electrodes 30, 35 are substantially equally spaced from the base line electrode 25. The second scale electrode 35 also carries two strips 36 and 37. Each strip forms an extension to the ends of the base line 27 defined by the graduated base line electrode 25 and each strip has a single further graduation. Two further numerical marking elements 0, and 130 forming part of the second scale electrode 35 and are positioned adjacent these further graduations so that the scale indicated by the second scale electrode extends from 0 to 130. Alphabetic symbols 40 attached to the second scale electrode 35 indicate the units of the scale as being MPH (miles per hour). A lead strip 42 connects the second scale electrode 35 to a terminal 42' at the edge of the glass sheet 2. The provision of the strips 36 and 37 allows the numerical marking elements on the scale electrodes 30 and 35 to be arranged alternately alongside the graduated base line electrode 25 without overlap and in a manner which allows the leads from the scale electrodes to be run to the edge of the sheet 2 without contacting any of the other leads.

The two scale electrodes 30 and 35 thus provide two selectable sets of scale calibrations for the graduated base line electrode 25 against which an indication on the first display area can be read.

The second electrode screen 50 is illustrated in FIG. 2. This screen comprises a continuous strip of conductive material which is so shaped that, when the two electrode screens are in opposition and appear superimposed, the second screen registers only with those parts of the first electrode screen which are intended for viewing, namely the rectangular electrodes 20, base line 27, the graduations 26, the alphabetic symbols 31, 40, the numerical marking elements of the first scale electrode 30, and the numerical marking elements and extension strips 36, 37 of the second scale electrode 35. The second electrode screen is cut away at all other points so that it does not register with the leads 21, 29, 31 and 42 and the associated contacts 21', 29', 31' and 42'.

One edge of the second electrode screen 50 defines a capacitor plate 52 which registers with a second plate 53 carried by the glass sheet 2 on which the first electrode screen is carried. The two plates 52, 53 allow electrical potential to be applied to the second electrode screen 50 from the second capacitor plate 53. The display can therefore be activated by selectively supplying electrical current to the contacts 21', 29', 31' and 42' of the first electrode screen and to the capacitor plate 53. Since all these components are carried by the same glass sheet 2 it is only necessary to attach electrical input leads to one of the glass sheets, which facilitate manufacture of the display.

The first and second electrode screens combine to define four display areas which can be activated separately. The first display area is activated by applying an electrical potential between the array of square electrodes 20 on the first screen electrode on the second electrode screen via the contacts 21' and the plate 53. Each of the individual electrodes 20 cooperates with the second electrode screen 50 to define a series of adjacent display zones along the line of the array, each zone being capable of activation separately from the others.

The second display area is activated by applying an electrical potential between the graduated base line electrode 25 on the first electrode screen and the second electrode screen via the contact 29' and the plate 53. The length of the base line 27 indicates a minimum range from which it can be varied.

The two scale electrodes 30, 35 on the first electrode screen cooperate with the second electrode screen 50 to provide two scale display areas which can be activated separately, from each other and from the first and second scale display areas. If it is desired to obtain an indication of speed in kilometers per hour, an electrical potential is applied between the first scale electrode 30, via the contact 32' and the plate 53 thus activating the first scale display area. A voltage signal representing zero speed is applied between the second screen and the square electrode 20a in the array 20 opposite the zero indicium on the first scale electrode thus activating one zone on the first display area. As the velocity increases, voltage is applied to successive electrodes in the array 20 to the right of the electrode area thus activating further zones in the display area. The activated section of the first display area thus has a length proportional to the vehicle velocity, and the position of the first-illuminated zone of the first display area indicates the speed of the vehicle in kilometers per hour calibrated against the first scale electrode 30.

If it is desired to indicate the speed in miles per hour, a voltage is applied between the second electrode screen and the second scale electrode 35, instead of the first scale electrode 30, thus activating the second of the two scale display areas. A voltage representing zero speed is then applied between the second electrode screen and the square electrode 20b in the array 20 opposite the 0 incidium on the second scale electrode 25. As the vehicle speed increases, adjacent display zones in the first display area are successively activated, as described above, so that the position of the last illuminated zone of the first display area indicates the speed of the vehicle in miles per hour against the calibration of the graduated base line electrode provided by the second scale electrode 35.

The embodiment of the invention described above therefore includes an electrode screen arrangement for the liquid crystal display which permits a single display area controlled in response to a measured value, i.e. vehicle speed, to be used to indicate the value in either one of two different units of measurement.

I claim:

1. An electrically controlled display device for selectively displaying a desired value along a graduated base line display according to a selectable one of a plurality of displayable scales comprising:
   two opposed planar electrode screens disposed across an optically active display medium;
   a first one of said electrode screens includes a first electrode means for defining said base line display with a plurality of spaced graduation points therealong and said first electrode means is electrically connected to an electrode terminal, a second electrode means for defining a linear array of individual display points adjacent and along said defined graduated base line and each individual point in said array is electrically connected to a corresponding electrode terminal, a third electrode means for defining a first of said selectably displayable scales of values over a predetermined range and containing a plurality of numerical marking elements indicative of said values positioned adjacent alternate ones of said graduation points on said base line display, said first scale numerical marking elements are interconnected by a first common electrical conductor for a corresponding electrode terminal, a fourth electrode means for defining a second of said selectably displayable scales of values over a predetermined range and containing a plurality of numerical marking elements indicative of said values positioned adjacent to the other ones of said alternate graduation points between the numerical marking elements of said third electrode means, said second scale numerical marking elements are interconnected by a second common electrical conductor to a corresponding electrode terminal; and
   a second one of said electrode screens includes a single conducting electrode formed to be disposed directly opposite said graduated base line, said linear array and said first and second scale elements to provide a counter electrode for displaying said oppositely disposed elements.

2. An electrically controlled display device as in claim 1, wherein said first electrode means includes means for defining a graduated base line extension display element at one end of said base line display and said extension element is electrically connected to said first common electrical conductor and said second electrode screen conductor provides a counter electrode for displaying said extension element.

3. An electrically controlled display device as in claim 1, wherein said first electrode means includes means for defining graduated base line extension display elements at both ends of said base line display and said extension elements are electrically connected to said first common electrical conductor and said second electrode screen conductor provides a counter electrode for displaying said extension elements.

4. An electrically controlled display device as in claim 1, wherein said first one of said electrode screens includes a conducting element defining a first capacitive plate and said second electrode screen conductor includes a portion defining an opposing second capacitive plate and all electrical connections to effect a display are made to elements of said first electrode screen.

5. An electrically controlled display device as in claim 1, wherein said optically active display medium comprises liquid crystal material.

6. An electrically controlled display device as in claims 3 or 5, wherein said first scale numerical marking elements are indicia shaped electrode areas for calibrating adjacent graduation points in values corresponding to a predetermined range of miles per hour units and said second scale numerical marking elements are indicia shaped electrode areas for calibrating adjacent graduation points in values corresponding to a predetermined range of kilometers per hour units.

* * * * *